United States Patent
Shi et al.

(10) Patent No.: US 9,761,325 B1
(45) Date of Patent: Sep. 12, 2017

(54) MEMORY SYSTEM

(71) Applicant: Kabushiki Kaisha Toshiba, Minato-ku, Tokyo (JP)

(72) Inventors: Juan Shi, Yokohama Kanagawa (JP); Hironori Uchikawa, Fujisawa Kanagawa (JP); Tokumasa Hara, Kawasaki Kanagawa (JP); Osamu Torii, Setagaya Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/068,938

(22) Filed: Mar. 14, 2016

(51) Int. Cl.
G11C 29/00 (2006.01)
G11C 29/02 (2006.01)
G11C 7/00 (2006.01)

(52) U.S. Cl.
CPC .............. *G11C 29/021* (2013.01); *G11C 7/00* (2013.01)

(58) Field of Classification Search
None
See application file for complete search history.

(56) References Cited

U.S. PATENT DOCUMENTS

| | | | | |
|---|---|---|---|---|
| 2007/0288833 A1* | 12/2007 | Djurdjevic | ....... | G11B 20/10009 714/784 |
| 2013/0128876 A1* | 5/2013 | Kilian | ............ | H03M 13/6306 370/347 |
| 2013/0238959 A1* | 9/2013 | Birk | .......... | G11C 7/02 714/773 |
| 2014/0136927 A1* | 5/2014 | Li | ........ | G06F 11/1048 714/768 |
| 2016/0246673 A1* | 8/2016 | Kim | .................. | H03M 13/3746 |

OTHER PUBLICATIONS

Minghai Qin et al., "Constrained Codes that Mitigate Inter-Cell Interference in Read/Write Cycles for Flash Memories," IEEE Journal on Selected Areas in Communications, vol. 32, No. 5, May 2014, pp. 836-846.
Veeresh Taranalli et al., "Error Analysis and Inter-Cell Interference Mitigation in Multi-Level Cell Flash Memories," IEEE ICC 2015 SAC—Data Storage and Cloud Computing, 2015, pp. 271-276.
Ashish Jagmohan et al., "Adaptive Endurance Coding for NAND Flash," IEEE Globecom 2010 Workshop on Application of Communication Theory to Emerging Memory Technologies, 2010, pp. 1841-1845.
Shuhei Tanakamaru et al., "95%-Lower-BER 43%-Lower-Power Intelligent Solid-State Drive (SSD) with Asymmetric coding and Stripe Pattern Elimination Algorithm," IEEE International Solid-State Circuits Conference (ISSCC), Feb. 2011, pp. 204-205.

* cited by examiner

*Primary Examiner* — M. Mujtaba Chaudry
(74) *Attorney, Agent, or Firm* — White & Case LLP

(57) ABSTRACT

According to one embodiment, a memory system includes a non-volatile memory, a memory interface that performs programming and reading out with respect to the non-volatile memory, a code processor that generates a code word by encoding; and a controller that sets a threshold-voltage read level for determining whether a value of each bit in a received word read out from the non-volatile memory is "0" or "1". A difference between the number of bits which have value equals "0" and the number of bits which have value equals "1" in the code word depends on a code rate of the encoding. The controller obtains the threshold-voltage read level based on the code rate.

10 Claims, 11 Drawing Sheets

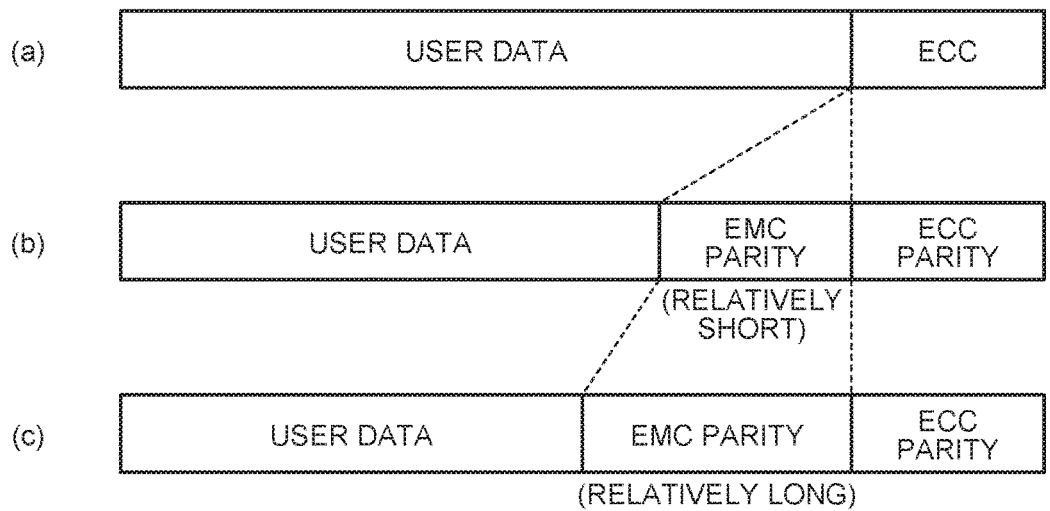
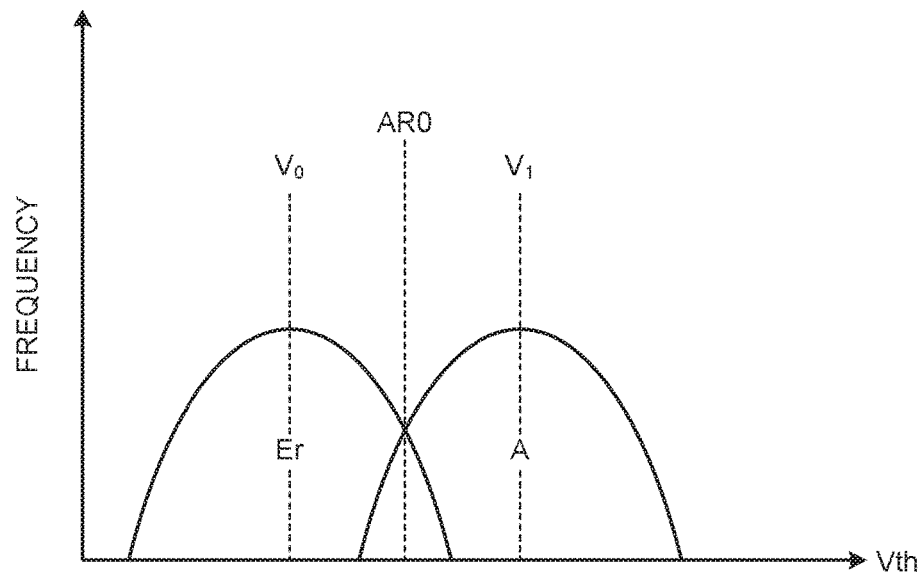

MEMORY SYSTEM

FIELD

Embodiments described herein relate generally to a memory system.

BACKGROUND

The error-occurred probability in a semiconductor memory differs according to patterns of data to be programmed. For this reason, when user data is encoded into a highly reliable pattern and programmed to a semiconductor memory, the reliability of the programmed data can be enhanced.

BRIEF DESCRIPTION OF THE DRAWINGS

FIG. 3 includes diagrams illustrating examples of code words output from the code processor in a case of which error mitigating coding is not performed and in other two cases of which error mitigating coding is performed with different code rates in the first embodiment, of which (b) is with higher code rate and (c) is with lower code rate;

FIG. 4 is a diagram illustrating threshold voltage distributions in a case where the code word illustrated in FIG. 3(a) is programmed to a non-volatile memory;

DETAILED DESCRIPTION

According to embodiments illustrated by examples below, a memory system is provided that includes: a non-volatile memory; a memory interface that performs programming and reading out with respect to the non-volatile memory; a code processor that generates code words by encoding; and a controller that sets a threshold-voltage read level for determining whether a value of each bit(SLC)/cell(MLC/TLC, and so on) in a received word read out from the non-volatile memory is a first value or a second value, wherein a difference between the number of first values and the number of second values in the code word depends on a code rate of the encoding, and the controller obtains the threshold-voltage read level based on the code rate. For each read, first value is smaller than this read out level and second value is larger than it, which can be simply regarded as the values of two states which locate in the left and right hand side of this voltage read out level. The number of states can be correspondingly extended to at most $k=2^l$ if there are l bits in a cell.

Exemplary embodiments of a memory system will be explained below in detail with reference to the accompanying drawings. The present invention is not limited to the following embodiments.

First Embodiment

Figure 1:
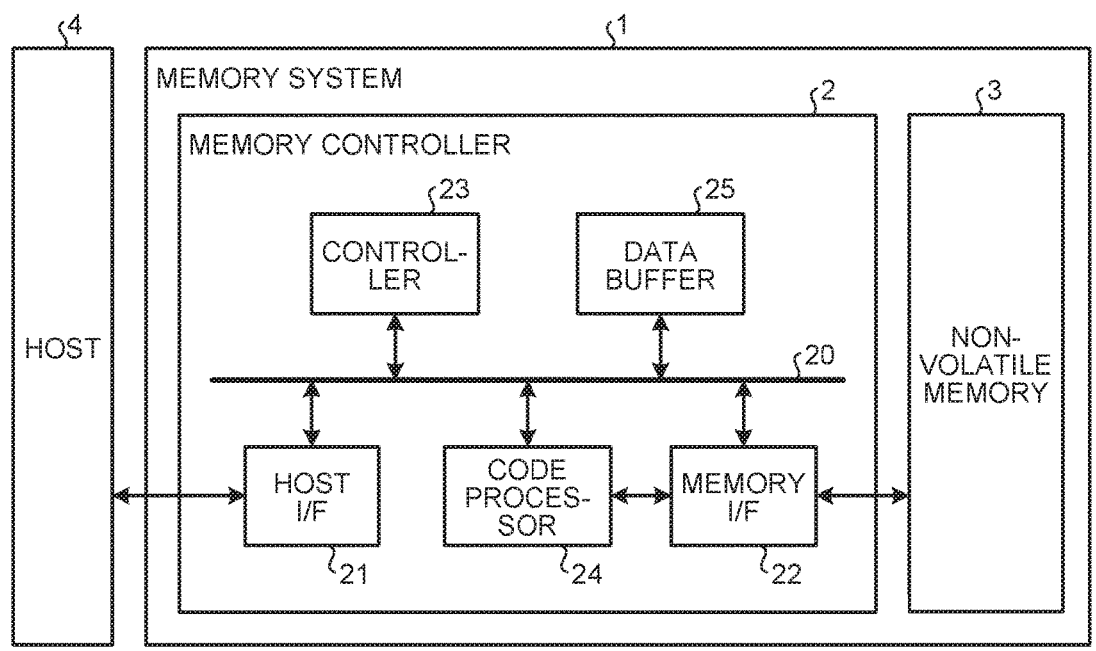
FIG. 1 is a block diagram illustrating a schematic configuration example of a memory system according to the first to fourth embodiments.

FIG. 1 is a block diagram illustrating a schematic configuration example of a memory system according to the first embodiment. As illustrated in FIG. 1, a memory system 1 according to the first embodiment includes a memory controller 2 and the non-volatile memory 3. The memory system 1 can be a memory card including the memory controller 2 and the non-volatile memory 3 constituted as one package, an SSD (solid state drive), or the like. The memory system 1 is connectable to a host 4. FIG. 1 illustrates a state of the memory system 1 connected to the host 4. The host 4 can be an electronic device such as a personal computer or a portable terminal.

The non-volatile memory 3 is a non-volatile memory that stores therein data in a non-volatile manner and is, for example, a NAND flash memory. However, the non-volatile memory 3 is not limited thereto and a three-dimensional flash memory, a ReRAM (resistance random access memory), a FeRAM (ferroelectric random access memory), or the like can be used as the non-volatile memory 3. While a case where a semiconductor memory is used as the non-volatile memory 3 is illustrated as an example in the first embodiment, the first embodiment is not limited to this case and a storage device other than the semiconductor memory can be used as the non-volatile memory 3.

The memory controller 2 controls programming to the non-volatile memory 3 according to a program command (request) from the host 4. The memory controller 2 also controls read out from the non-volatile memory 3 according to a read command from the host 4. The memory controller 2 includes a host interface (host I/F) 21, the memory interface (memory I/F) 22, a controller 23, the code processor 24, and a data buffer 25. The host I/F 21, the memory I/F 22, the controller 23, the code processor 24, and the data buffer 25 are connected to each other with an internal bus 20.

The host I/F 21 performs processing in accordance with interface standards with the host 4 and outputs a direction, user data, and the like received from the host 4 to the internal bus 20. The host I/F 21 also transmits user data read out from the non-volatile memory 3, a response from the controller 23, and the like to the host 4. The interface standards with the host 4 can be various interface standards such as serial ATA (advanced technology attachment), USB (universal serial bus), or the like. In the first embodiment, data programmed to the non-volatile memory 3 in response to a program request from the host 4 is referred to as user data.

The user data is stored in the non-volatile memory 3 after encoded by the code processor 24 as will be described later.

The memory I/F 22 performs write processing to the non-volatile memory 3 based on an instruction of the controller 23. The memory I/F 22 also performs readout processing from the non-volatile memory 3 based on an instruction of the controller 23. That is, the controller 23 performs programming and reading out to/from the non-volatile memory 3 via the memory I/F 22.

The controller 23 is a controller that controls constituent elements of the memory system 1 in an integrated manner. Upon reception of a direction from the host 4 via the host I/F 21, the controller 23 executes control according to the direction. For example, upon reception of a program request from the host 4, the controller 23 instructs the code processor 24 to encode user data and instructs the memory I/F 22 to program coded user data (i.e., a code word) to the non-volatile memory 3. Upon reception of a readout request from the host 4, the controller 23 instructs the memory I/F 22 to read out user data that is requested to read out from the non-volatile memory 3 and instructs the code processor 24 to decode the read out user data (i.e., a received word).

Upon reception of a program request from the host 4, the controller 23 determines a storage area (memory area) on the non-volatile memory 3 for user data stored in the data buffer 25. That is, the controller 23 manages a program destination of the user data. A correspondence between a logical address of user data received from the host 4 and a physical address indicating the storage area on the non-volatile memory 3 in which the user data is managed by using an address conversion table.

Upon reception of a readout request from the host 4, the controller 23 converts a logical address designated by a readout request into a physical address using the address conversion table described above and instructs the memory I/F 22 to read out data from the physical address.

The non--volatile memory 3 constructed from a NAND flash memory, or the like, has a structure that memory cells are provided at cross-points of a plurality of word lines and a plurality of bit lines, the plurality of word lines and the plurality of bit lines being arranged in a reticular pattern. In such NAND flash memory, programming and reading out are performed in data units called "pages" and erase is performed in data units called "blocks". In each embodiment, a plurality of memory cells connected to the same word line is referred to as "memory cell group". When each memory cell is a single-level cell (SLC) which can store a single bit, one memory cell group corresponds to one page. When each memory cell is a multi-level cell (MLC) which can store plural bits, one memory cell group corresponds to a plurality of pages. Each memory cell is connected to a bit line as well as to a word line. Therefore, each memory cell can be identified using an address identifying a word line and an address identifying a bit line.

The data buffer 25 temporarily holds therein user data received by the memory controller 2 from the host 4 until the user data is stored in the non-volatile memory 3. The user data received from the host 4 is transferred to the data buffer 25 via the internal bus 20. The data buffer 25 also temporarily holds therein user data read out from the non-volatile memory 3 until the user data is transmitted to the host 4. The data buffer 25 further temporarily stores therein a code word generated by coding of user data. The data buffer 25 can be constituted of a general-purpose memory such as an SRAM (static random access memory) or a DRAM (dynamic random access memory).

The code processor 24 generates a code word by encoding user data stored in the data buffer 25. The code processor 24 also decodes user data (i.e., a received word) read out from the non-volatile memory 3.

Figure 2:
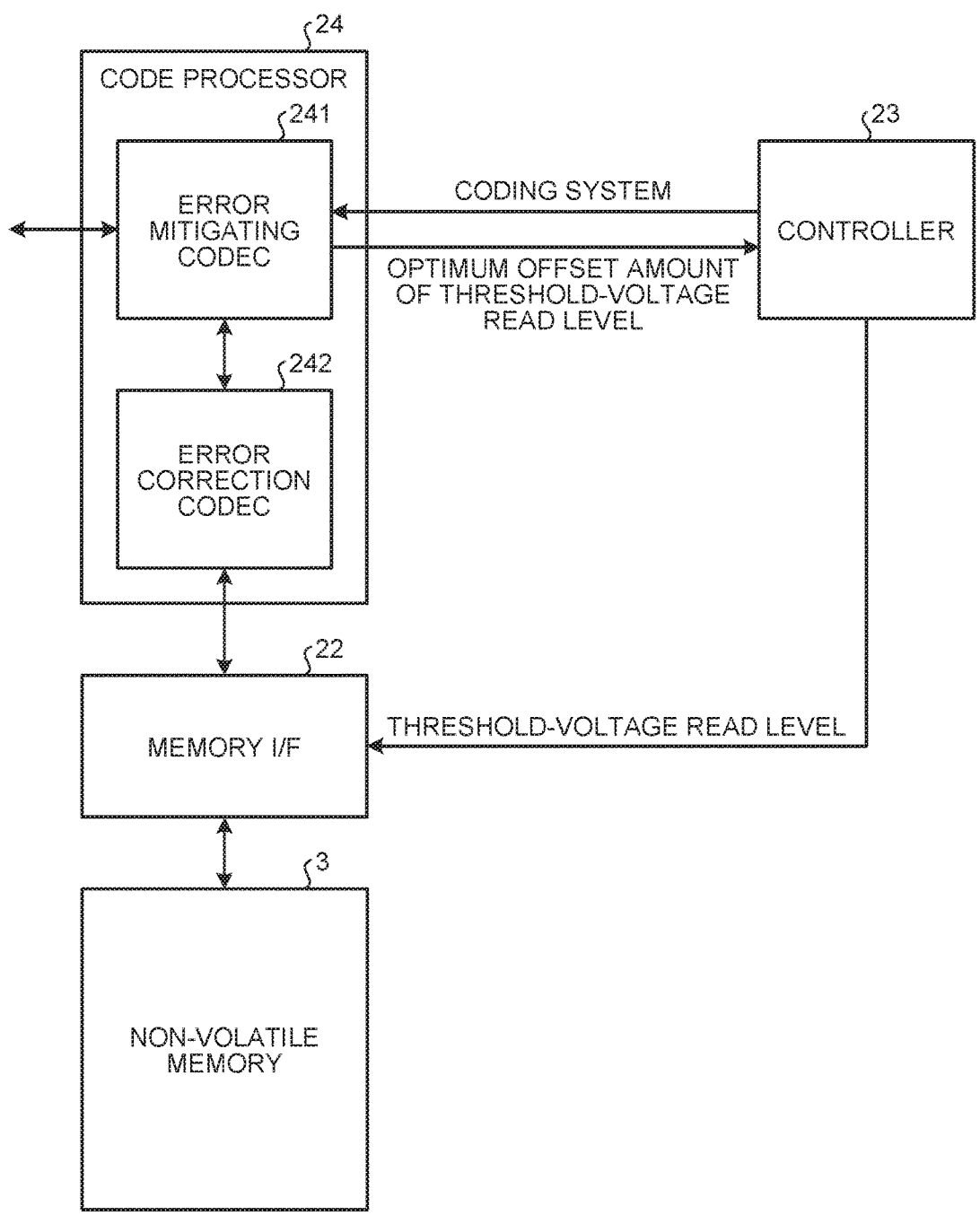
FIG. 2 is a block diagram illustrating a more detailed configuration example of a code processor according to the first to fourth embodiments.

FIG. 2 illustrates a more detailed configuration example of the code processor 24 according to the first embodiment. As illustrated in FIG. 2, the code processor 24 includes an error mitigating codec 241 and an error correction codec 242.

The error mitigating codec 241 performs coding to generate a code word (also as "coding sequence") in which occurrence frequencies of bits which have exemplary value equals '0' (first value) and bits which have exemplary value equals '1' (second value) are biased. In the present descriptions, such coding is referred to as "error mitigating coding". A code used in the error mitigating coding is referred to as "error mitigating code". We may use EMC as shortage for "error mitigating coding" or "error mitigating code" in the following descriptions under the circumstance of unambiguous.

In this explanation, the occurrence frequency means the number of times (frequency) that an objective value occurs in a bit string constructing a code word, and it is a value decided depending on a coding system and a code rate of an error mitigating coding. Accordingly, a state where the occurrence frequencies of 0s and 1s are biased indicates that there is a difference between the number (number of occurrences) of bits which have value equals '0' and the number (number of occurrences) of bits which have value equals '1' in a code word as in the result of the error mitigating coding. The difference varies depending on the code rate of the error mitigating coding. However, in addition to the code rate of the error mitigating coding, the number (number of occurrences) of bits which have value equals '0' and the number (number of occurrences) of bits which have value equals '1' actually included in the code word also depend on user data being encoded. Therefore, in the following explanation, when a difference between an occurrence frequency of bits which have value equals '0' and an occurrence frequency of bits which have value equals '1' which are decided based on the coding system and the code rate of the error mitigating coding is greater than a predetermined value, it will be referred that the occurrence frequencies of 0s and 1s are biased, or that the occurrence frequencies of 0s and 1s are different.

As the coding to generate a code word in which the occurrence frequencies of 0s and 1s are biased, there are first to fourth methods of encoding. The first method of encoding generates a code word with a fixed bit length by encoding an information source symbol (pre-encoded data) with a fixed bit length. The second method of encoding generates a code word with a variable bit length by encoding an information source symbol with a fixed bit length. The third method of encoding generates a code word with a fixed bit length by encoding an information source symbol with a variable bit length. The fourth method of encoding generates a code word with a variable bit length by encoding an information source symbol with a variable bit length. The first method of encoding is hereinafter referred to as "fixed length method". The second to fourth methods of encoding are referred to as "variable length method".

The variable length method can realize a higher average code rate than the fixed length method. This means that the variable length method can generate a stronger -biased code word in the occurrence frequencies of 0s and 1s than the fixed length method under the same code rate. Therefore, in the first embodiment, coding by the variable length method is used as the coding performed by the error mitigating codec 241.

As the coding by the variable length method, an entropy coding such as Reverse Huffman coding, Reverse Tunstall coding, Reverse Tunstall Huffman coding, or the like, can be exemplified. The Reverse Huffman coding is coding that is reverse processing of Huffman coding. The Reverse Tunstall Huffman coding is reverse processing of Tunstall Huffman coding. The Reverse Tunstall coding is reverse processing of Tunstall coding. The Huffman coding and the Tunstall coding are coding used for data compression and the like. The Tunstall Huffman coding is coding in which the Huffman coding is further performed to a result of the Tunstall coding.

As the other codings capable of being used for the error mitigating codec 241, an inter-cell interference (ICI)-mitigating coding in which programming-target data is encoded so that a pattern of data programmed in memory cells becomes a pattern capable of suppressing inter-cell interference, an endurance coding in which programming -target data is encoded so that a pattern programmed in memory cells becomes a pattern capable of increasing the number of program/erase cycles that a memory can endure, an asymmetric coding capable of changing rates of 1s and 0s in data (i.e., a code word) to be programmed in a memory, and so forth, can be some of the examples.

The error mitigating codec 241 performing the above-described error mitigating coding inputs a result of the error mitigating coding to the error correction codec 242. The error correction codec 242 performs error correction coding of data generated by error mitigating coding to further enhance the reliability of the non -volatile memory 3. Any method can be used as the error correction coding performed by the error correction codec 242 and, for example, RS (reed solomon) coding or BCH (bose chaudhuri hocquenghem) coding can be used.

At the time of programming data to the non -volatile memory 3, the controller 23 instructs the error mitigating codec 241 to perform error mitigating coding of user data temporarily held in the data buffer 25 and instructs the error correction codec 242 to perform error correction coding of data obtained by the error mitigating coding which is operated by the error mitigating codec 241. Code words output as a result from the error correction codec 242 are programmed to the non-volatile memory 3 by the memory I/F 22.

At the time of readout of data from the non -volatile memory 3, the controller 23 instructs the error correction codec 242 to perform error correction decoding of a received word read out from the non-volatile memory 3 by the memory I/F 22 and instructs the error mitigating codec 241 to perform error mitigation decoding of data decoded by the error correction codec 242. As a result, user data requested by the host 4 is output from the error mitigating codec 241.

While an example in which the error correction coding is performed after the error mitigating coding is described above, the embodiments are not limited thereto. For example, the error correction coding of user data can be first performed and the error mitigating coding can be performed regarding code words obtained by the error correction coding as information source sequences. However, when coding information is to be stored together with the corresponding data in the non-volatile memory 3, it is desirable to perform the error correction coding after the error mitigating coding to protect the coding information by the error correction coding.

As described above, the code word in which the occurrence frequencies of 0s and 1s biased is programmed in the non-volatile memory 3. Thus, by having the structure in that the code word in which the occurrence frequencies of 0s and 1s biased is programmed in the non-volatile memory 3, rather than a structure in that a code word in which the occurrence frequencies of 0s and 1s even is programmed, it is possible to enhance reliability of data (received word) read out from the non-volatile memory 3. This is because, by biasing the occurrence frequencies of 0s and 1s in the code word being a programming target, it is possible to reduce the possibilities of the values of the code word programmed in the non-volatile memory 3 being changed before their being read out. If the possibilities of the values being changed before their being read out can be reduced, the raw bit error rate (RBER) of data (received word) read out from the non-volatile memory 3 can be reduced, and thereby, it is possible to enhance the reliability of the memory system 1.

In the following descriptions, a case where cells of the non-volatile memory 3 are SLCs is cited as an example for the sake of simplicity. When the occurrence frequencies of 0s and 1s are different in this manner, a size of a distribution of threshold voltage levels (hereinafter referred to as threshold voltage distribution) of each value ('0' and '1') programmed in the non-volatile memory 3 may be biased, and thereby, an optimal threshold -voltage read level for distinguishing values ('0' or '1') read out from memory cells may be changed.

The threshold-voltage read level is a threshold voltage level for determining whether a value (threshold voltage level) read out from a memory cell is '0' or '1'. The optimal threshold-voltage read level is a threshold voltage level where a RBER becomes minimum when used for determining whether a value (threshold voltage level) read out from a memory cell is '0' or '1'.

For instance, when an occurrence frequency of bits with '1' of which memory cell is programmed with lower threshold voltage level is greater than an occurrence frequency of bits with '0' of which memory cell is programmed with higher threshold voltage level, a threshold voltage distribution of memory cells programmed with the lower threshold voltage level (corresponding the value '1') expands while a threshold voltage distribution of memory cells programmed with the higher threshold voltage level (corresponding the values '0') reduces. Thereby, an optimal threshold-voltage read level for distinguishing the values '0' and the values '1' may shift toward the side of a higher threshold voltage level locates.

FIG. 3 includes diagrams illustrating examples of code words (coding sequences) output from the code processor in a case where the error mitigating coding is not performed and in a case where the error mitigating coding is performed. FIG. 3(a) illustrates a code word output in a case where the error mitigating coding is not performed, FIG. 3(b) illustrates a code word output in a case where the error mitigating coding with a relatively high code rate is performed, and FIG. 3(c) illustrates a code word output in a case where the error mitigating coding with a relatively low code rate is performed.

Figure 5:
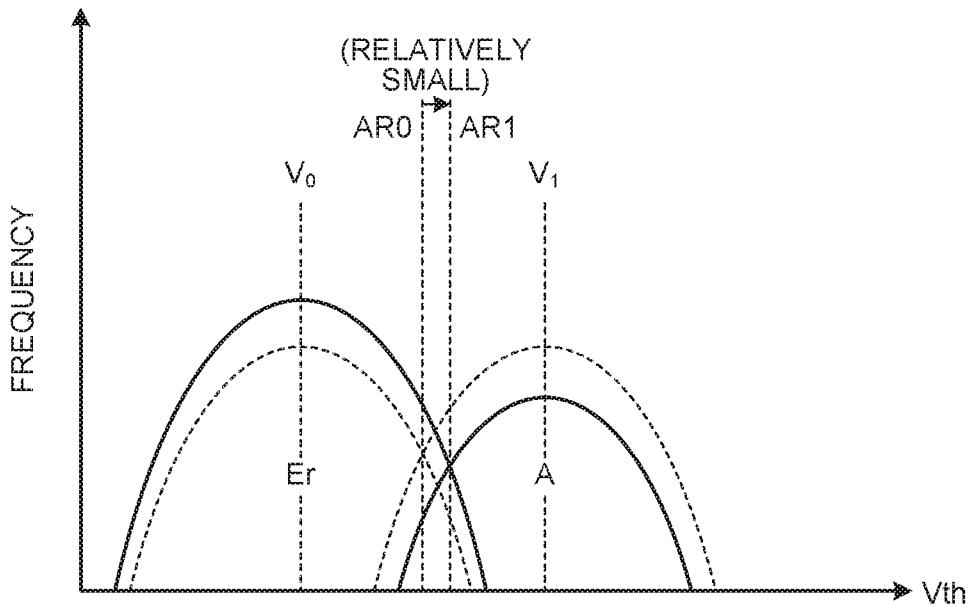
FIG. 5 is a diagram illustrating threshold voltage distributions in a case where the code word illustrated in FIG. 3(b) is programmed to a non-volatile memory.
Figure 6:
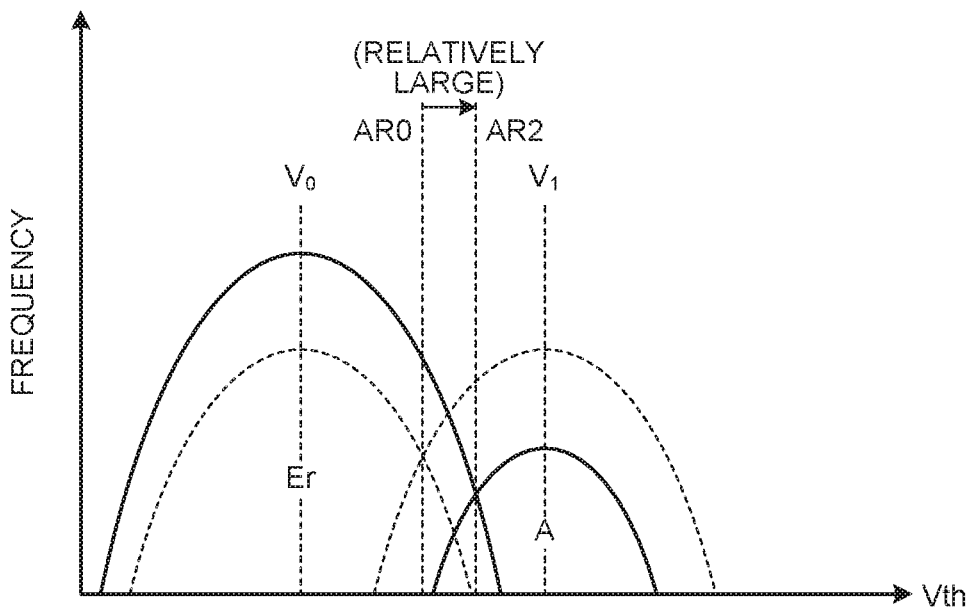
FIG. 6 is a diagram illustrating threshold voltage distributions in a case where the code word illustrated in FIG. 3(c) is programmed to a non-volatile memory.

FIG. 4 illustrates threshold voltage distributions in a case where the code word illustrated in FIG. 3(a) is programmed to a non-volatile memory, FIG. 5 illustrates threshold voltage distributions in a case where the code word illustrated in FIG. 3(b) is programmed to a non-volatile memory, and FIG. 6 illustrates threshold voltage distributions in a case where the code word illustrated in FIG. 3(c) is programmed to a non-volatile memory.

When the error mitigating coding is not performed, the error correction coding of user data is performed as coding by the code processor 24. Therefore, a code word in which user data and an error correction code (ECC) obtained by performing the error correction coding of the user data are concatenated is output from the code processor 24 as illustrated in FIG. 3(*a*).

Normally, when a code word generated in the case where the error mitigating coding is not performed is programmed to the non-volatile memory 3, a threshold voltage distribution of memory cells in state "Erase" (noted as "Er" in FIG. 4), saying of which the value '1' is programmed and a threshold voltage distribution of memory cells in state "A", saying of which the value '0' is programmed ideally become Gaussian distributions with the same size as illustrated in FIG. 4. In this case, an optimal threshold-voltage read level AR0 are just an intermediate threshold voltage level between a voltage $V_0$ corresponding to a frequency peak of the threshold voltage distribution "Er" and a voltage $V_1$ corresponding to a frequency peak of the threshold voltage distribution "A".

The optimal threshold-voltage read level AR0 is equal to a threshold voltage level corresponding to a solution of a distribution function (hereinafter referred to as a Gaussian function as an ideal example) representing the threshold voltage distribution "Er" and a Gaussian function representing the threshold voltage distribution "A" as well. The solution corresponds to a cross-point of a curve representing the threshold voltage distribution "Er" and a curve representing the threshold voltage distribution "A" in FIG. 4. Therefore, the optimal threshold-voltage read level AR0 is a threshold voltage level corresponding to the cross-point of the curve representing the threshold voltage distribution "Er" and the curve representing the threshold voltage distribution "A" in FIG. 4. The correspondence between an optimal threshold-voltage read level and a solution of assumed functions representing threshold voltage distributions is the same in a case where occurrence frequencies of 0s and 1s are different, that is, in a case where sizes of the threshold voltage distributions "Er" and "A" are biased.

On the other hand, in a case where the error mitigating coding is performed, the error mitigating coding is performed to user data and further the error correction coding is performed to data obtained by the error mitigating coding. In this case, a code word in which user data, redundant data (or parity part) obtained by both performing the error mitigating coding and the error correction coding to the user data are concatenated is output from the code processor 24 as illustrated in FIGS. 3(*b*) and 3(*c*). In the EMC encoded part among these pieces of data, the occurrence frequencies of 0s and 1s are biased. Accordingly, the occurrence frequencies of 0s and 1s are also biased in the entire code word output from the code processor 24. In some exemplary EMC encoded data, the occurrence frequency of '1's is higher than that of '0's. Therefore, more '1' s are included in the entire code word output from the code processor 24 than '0's.

When such a code word in which the occurrence frequencies of 0s and 1s are biased is programmed to the non-volatile memory 3, the threshold voltage distribution "Er" and the threshold voltage distribution "A" which can be regarded as following Gaussian distributions having different sizes, respectively, as illustrated in FIGS. 5 and 6. In this case, optimal threshold-voltage read levels AR1 and AR2 for each code word, that is, a solution of the Gaussian function representing the threshold voltage distribution "Er" and the Gaussian function representing the threshold voltage distribution "A" (the cross-point of the curve representing the threshold voltage distribution "Er" and the curve representing the threshold voltage distribution "A" in FIGS. 5 and 6), shifts toward a side of a threshold voltage level higher than an intermediate threshold voltage level between the threshold voltage level $V_0$ corresponding to the frequency peak of the threshold voltage distribution "Er" and the threshold voltage level $V_1$ corresponding to the frequency peak of the threshold voltage distribution "A".

For example, when the occurrence frequency of "1" is higher than that of "0" in a case where a code length of a code word is constant, the number of bits which have value equals '1' in the code word becomes large while the number of bits which have value equals '0' becomes small. Accordingly, the size of the threshold voltage distribution "Er" is increased and the size of the threshold voltage distribution "A" is relatively reduced. This causes the solution of the Gaussian function representing the threshold voltage distribution "Er" and the Gaussian function representing the threshold voltage distribution "A" (the cross-point of the curve representing the threshold voltage distribution "Er" and the curve representing the threshold voltage distribution "A" in FIGS. 5 and 6) shifts toward the frequency peak of the threshold voltage distribution "A", that is, a higher threshold voltage. As a result, the optimal threshold-voltage read levels AR1 and AR2 also shift to higher threshold voltages.

Shift amounts (also as "offset amounts") of the optimal threshold-voltage read levels AR1 and AR2 depend on degrees of bias in the occurrence frequencies of 0s and 1s, that is, code rates of the error mitigating coding. For example, as illustrated in FIGS. 3(*b*) and 3(*c*), generated redundant data (that is, EMC parity) is longer in the case where the code rate is relatively low (see FIG. 3(*c*)) than in the case where the code rate is relatively high (see FIG. 3(*b*)). For this reason, in the entire code word output from the code processor 24, bias toward values '1' is larger in the case where the code rate is relatively low (see FIG. 3(*c*)) than in the case where the code rate is relatively high (see FIG. 3(*b*)). As a result, for example, as illustrated in FIGS. 5 and 6, the threshold-voltage read level AR2 in the case where the error mitigating coding with a relatively low code rate is performed (see FIG. 6) shifts toward a higher threshold voltage than the threshold-voltage read level AR1 in the case where the error mitigating coding with a relatively high code rate is performed (see FIG. 5).

In the first embodiment, the threshold-voltage read level is caused to shift according to the code rate of the error mitigating coding. This enables a more suitable threshold-voltage read level to be set according to the occurrence frequency of bits for each value and therefore a RBER of data (received word) read out from the non-volatile memory 3 can be reduced. As a result, the reliability of the memory system 1 can be enhanced. Furthermore, because it is possible to read data using a more preferred threshold-voltage read level, it is possible to improve tolerability of the memory system 1 against program/readout stresses of the non-volatile memory 3. As a result, it is also possible to extend a lifetime of the memory system 1.

The threshold-voltage read level corresponding to the code rate of the error mitigating coding is specified by, for example, the controller 23. The controller 23 therefore outputs the code rate and the coding system to the error mitigating codec 241 of the code processor 24 as illustrated in FIG. 2. The error mitigating codec 241 specifies an offset amount from a reference threshold -voltage read level (also referred to as a reference value) based on the input code rate and coding system and returns the specified offset amount to the controller 23. The controller 23 causes the threshold-voltage read level to shift from a reference value by the input offset amount to generate a more suitable threshold-voltage read level. The generated threshold-voltage read level is provided to the memory I/F 22. The memory I/F 22 determines whether a value read out from the non-volatile memory 3 is '0' or '1' using the provided threshold-voltage read level. The reference threshold-voltage read level (the reference value) can be a value of the threshold-voltage read level set for a case where the error mitigating coding is not performed, for example. The reference threshold-voltage read level can alternatively be a threshold-voltage read level that is optimal in a case where the occurrence frequencies of 0s and 1s are the same, for example.

To specify an offset amount, the error mitigating codec 241 can previously manage optimum offset amounts for combinations of the code rate and the coding system using a look-up table, or the like, or can predict respective occurrence frequencies of 0s and 1s based on the input code rate and coding system and generate the Gaussian functions of the threshold voltage distributions "Er" and "A" from the predicted occurrence frequencies to specify an offset amount based on the generated threshold voltage distributions of "Er" and "A".

Figure 7:
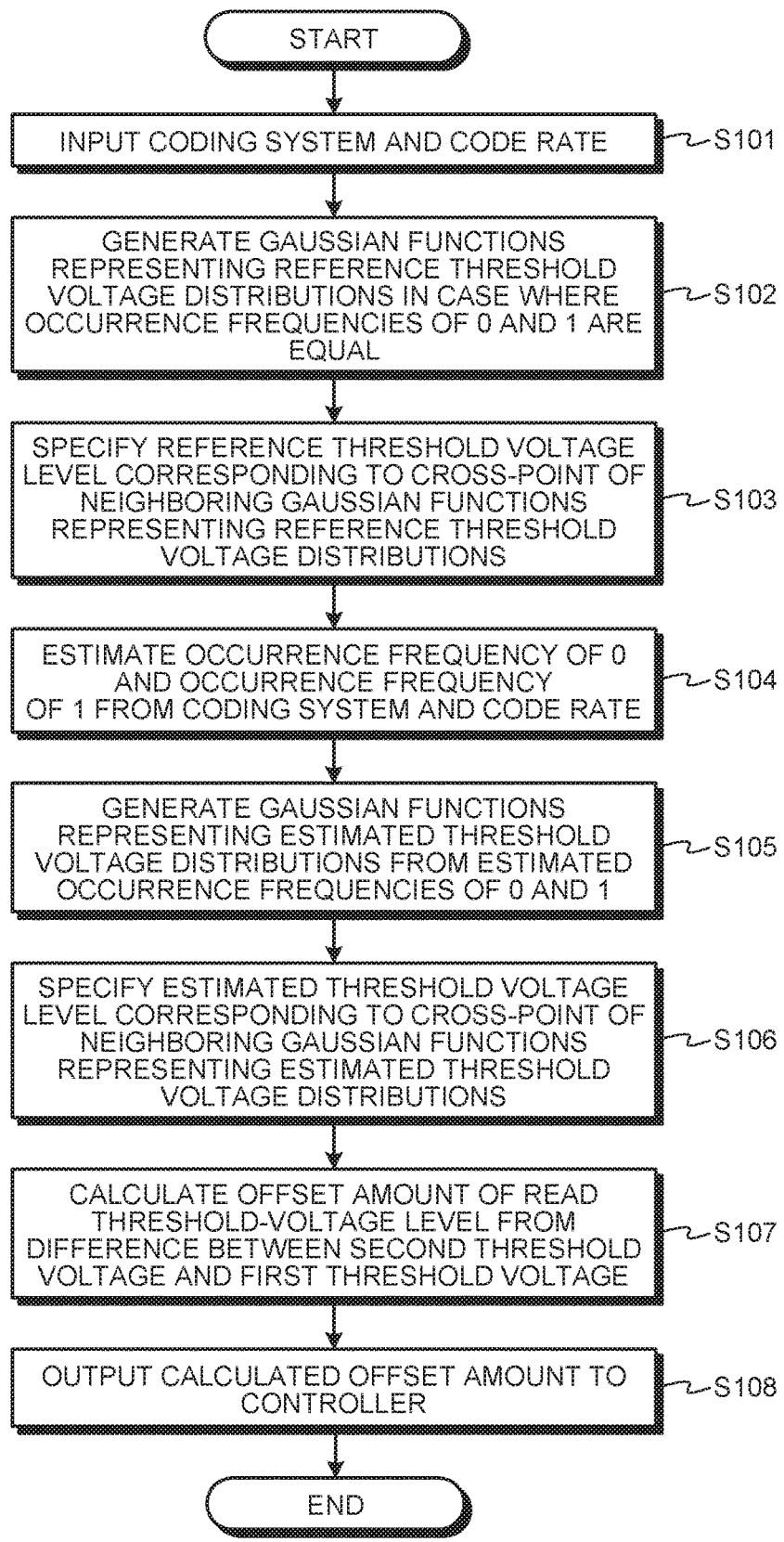
FIG. 7 is a flowchart illustrating a schematic operation example of the memory system according to the first embodiment of off-setting a threshold-voltage read level.
Figure 8:
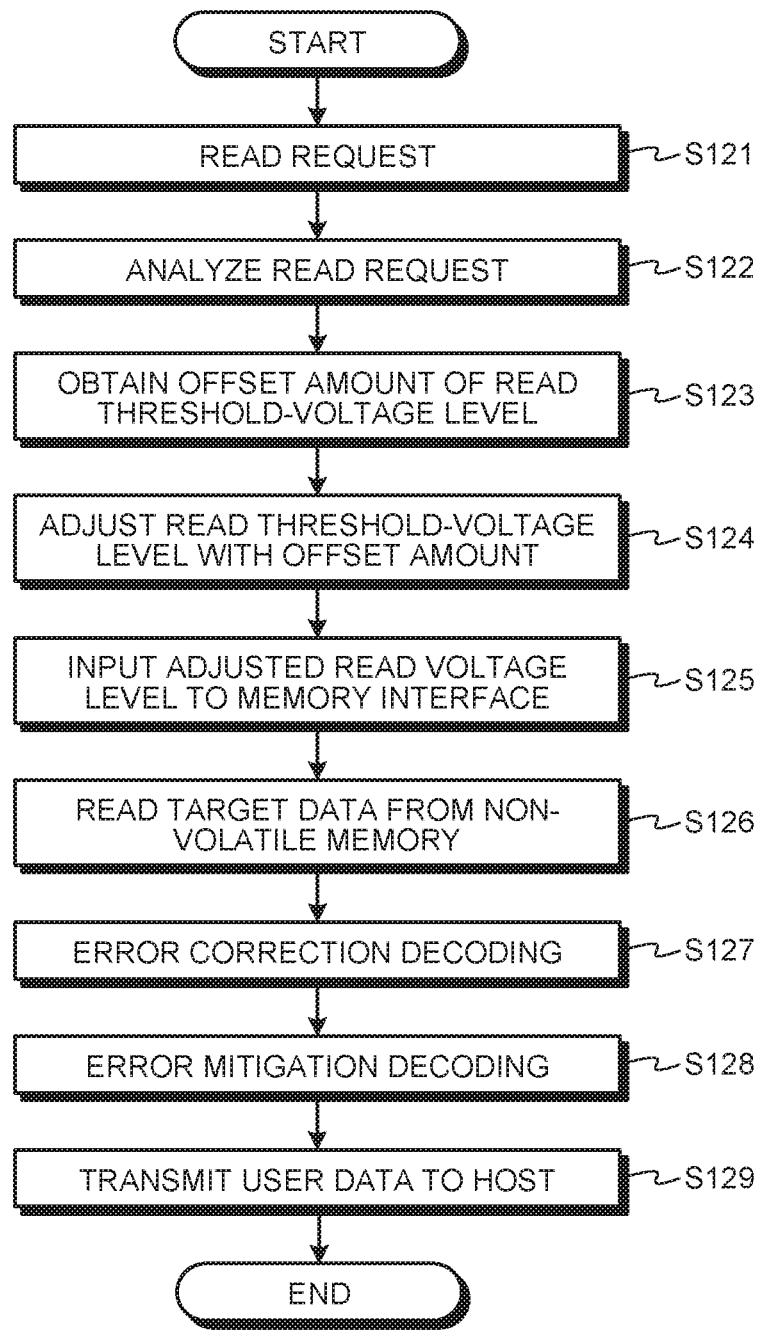
FIG. 8 is a flowchart illustrating a schematic operation example of the memory system according to the first to fourth embodiments at the time of readout.

An operation at the time of setting the threshold-voltage read level and an operation at the time of readout performed by the memory system 1 according to the first embodiment are described in detail next with reference to the drawings. FIG. 7 is a flowchart illustrating a schematic operation example of the memory system according to the first embodiment at the time of setting the threshold-voltage read level. FIG. 8 is a flowchart illustrating a schematic operation example of the memory system according to the first embodiment at the time of readout. Attention is focused in FIG. 7 on an operation of the error mitigating codec 241 illustrated in FIG. 2 and is focused in FIG. 8 on an operation of the controller 23 illustrated in FIG. 2. The operation of the memory system 1 at the time of programming can be a normal operation and thus detailed descriptions thereof will be omitted.

The operation at the time of setting the threshold-voltage read level illustrated in FIG. 7 is performed, for example, at the time of manufacturing, shipment, or startup of the memory system 1. As illustrated in FIG. 7, in the present operation, the error mitigating codec 241 receives the coding system and the code rate input from the controller 23 (Step S101). Subsequently, the error mitigating codec 241 generates Gaussian functions—representable threshold voltage distributions (reference threshold voltage distributions) of the values in a case where the occurrence frequencies of 0s and 1s are equal (Step S102). Subsequently, the error mitigating codec 241 obtains a solution of the generated Gaussian functions of the reference threshold voltage distribution, and specifies a threshold voltage level (reference voltage level) corresponding to the solution (Step S103). The reference threshold voltage distributions generated at Step S103 do not need to completely match distributions of threshold voltage levels of memory cells in a state where the values have been actually programmed to the non-volatile memory 3 and it suffices that a distance between frequency peaks of the respective distributions substantially match a distance between frequency peaks of actual distributions of threshold voltage levels of the non-volatile memory 3.

Next, the error mitigating codec 241 estimates an occurrence frequency of '0' and an occurrence frequency of '1' using the coding system and the code rate input at Step S101 (Step S104) and generates Gaussian functions representing distributions (estimated threshold voltage distribution) of threshold voltage level of memory cells to which respective values have been programmed based on the estimated occurrence frequencies (Step S105).

Next, the error mitigating codec 241 obtains a solution of the generated Gaussian functions of the estimated threshold voltage distributions, and specifies a threshold voltage level (estimated threshold voltage level) corresponding to the solution (Step S106). Subsequently, the error mitigating codec 241 obtains a difference between the estimated threshold voltage level and the reference threshold voltage level to calculate an offset amount from the threshold-voltage read level (Step S107), outputs the calculated offset amount to the controller 23 (Step S108), and ends the present operation. The offset amount output to the controller 23 can be held, for example, in a predetermined memory area of the non-volatile memory 3 or the data buffer 25.

As illustrated in FIG. 8, in the operation at the time of readout, the controller 23 first receives a readout request from the host 4 via the host I/F 21 (Step S121). The readout request includes a logical address on the non-volatile memory 3 at which user data as a readout target is stored. Subsequently, the controller 23 analyzes the input readout request (Step S122) to specify a physical address on the non-volatile memory 3 at which the user data as the readout target is stored.

Next, the controller 23 obtains the offset amount from the predetermined memory area (Step S123) and adjusts the threshold-voltage read level based on the obtained offset amount (Step S124). Subsequently, the controller 23 inputs the adjusted threshold-voltage read level to the memory I/F 22 (Step S125). In this way, the threshold-voltage read level in the memory I/F 22 is updated with the adjusted threshold-voltage read level.

Next, the controller 23 instructs the memory I/F 22 to read out the target data from the non-volatile memory 3 (Step S126). Subsequently, the controller 23 instructs the error correction codec 242 to perform error correction decoding of a read received word (Step S127) and instructs the error mitigating codec 241 to perform error mitigation decoding of data to which the error correction decoding has been performed by the error correction codec 242 (Step S128). In this way, the user data as the readout target is generated and temporarily stored in the data buffer 25.

Thereafter, the controller 23 transmits the user data temporarily stored in the data buffer 25 to the host 4 via the host I/F 21 (Step S129) and ends the present operation.

As described above, in the first embodiment, the threshold-voltage read level is adjusted to a threshold voltage level corresponding to a cross-point of adjacent voltage threshold distributions according to bias in the occurrence frequency of bits for each value obtained from the code rate in the error mitigating coding. This enables a more suitable threshold-voltage read level to be used to read out data from the non-volatile memory 3 and thus a lower RBER can be achieved. As a result, the memory system 1 with a higher reliability can be provided.

Furthermore, because readout of data using a more suitable threshold-voltage read level is enabled, the resistance of the memory system 1 to deterioration due to program/readout stresses of the non-volatile memory or the like is increased. As a result, the life of the memory system 1 can be elongated.

Second Embodiment

A memory system according to a second embodiment is described in detail next with reference to the drawings. In the following descriptions, configurations and operations identical to those described in the above embodiment are dented by like reference signs and redundant descriptions thereof will be omitted.

As described in the first embodiment, the occurrence frequency of bits which have value equals '0' and the occurrence frequency of bits which have value equals '1' in a code word generated by coding depend on the code rate of the error mitigating coding. This implies that expected values of the numbers of cells in each threshold voltage level of 0s and 1s have been programmed, respectively, can be obtained using the code rate of the error mitigating coding. Accordingly, in the second embodiment, a more suitable threshold-voltage read level is specified by obtaining expected values of the numbers of cells in each threshold voltage level.

For example, assuming that the cells in the non-volatile memory 3 are SLCs, a code rate R of coding can be expressed by the following expression (1) in a case where data as a program target does not include redundant data (EMC parity), that is, in a case where the error mitigating coding is not performed. In the following expression (1), a probability Pr(X=1) that a value (random variable) X is '1' is p and a probability Pr(X=0) that the value X is '0' is (1−p). H denotes entropy.

$$R = H_2(p) = -p\log_2 p - (1-p)\log_2(1-p) \ldots \quad (1)$$

Based on the above expression (1), the probability p that the value X is '1' can be obtained by the following expression (2) using an inverse function of the entropy.

$$p = H_2^{-1}(R) \ldots \quad (2)$$

In the second embodiment, the probability p that a value programmed to the non-volatile memory 3 is '1' and the probability (1−p) that the value is '0' are obtained using the code rate of the error mitigating coding and a more suitable threshold-voltage read level is generated based on threshold voltage distributions that can be specified by the obtained probabilities p and (1−p).

The configuration example of the memory system according to the second embodiment can be identical to, for example, the configuration example of the memory system 1 described in the first embodiment.

Figure 9:
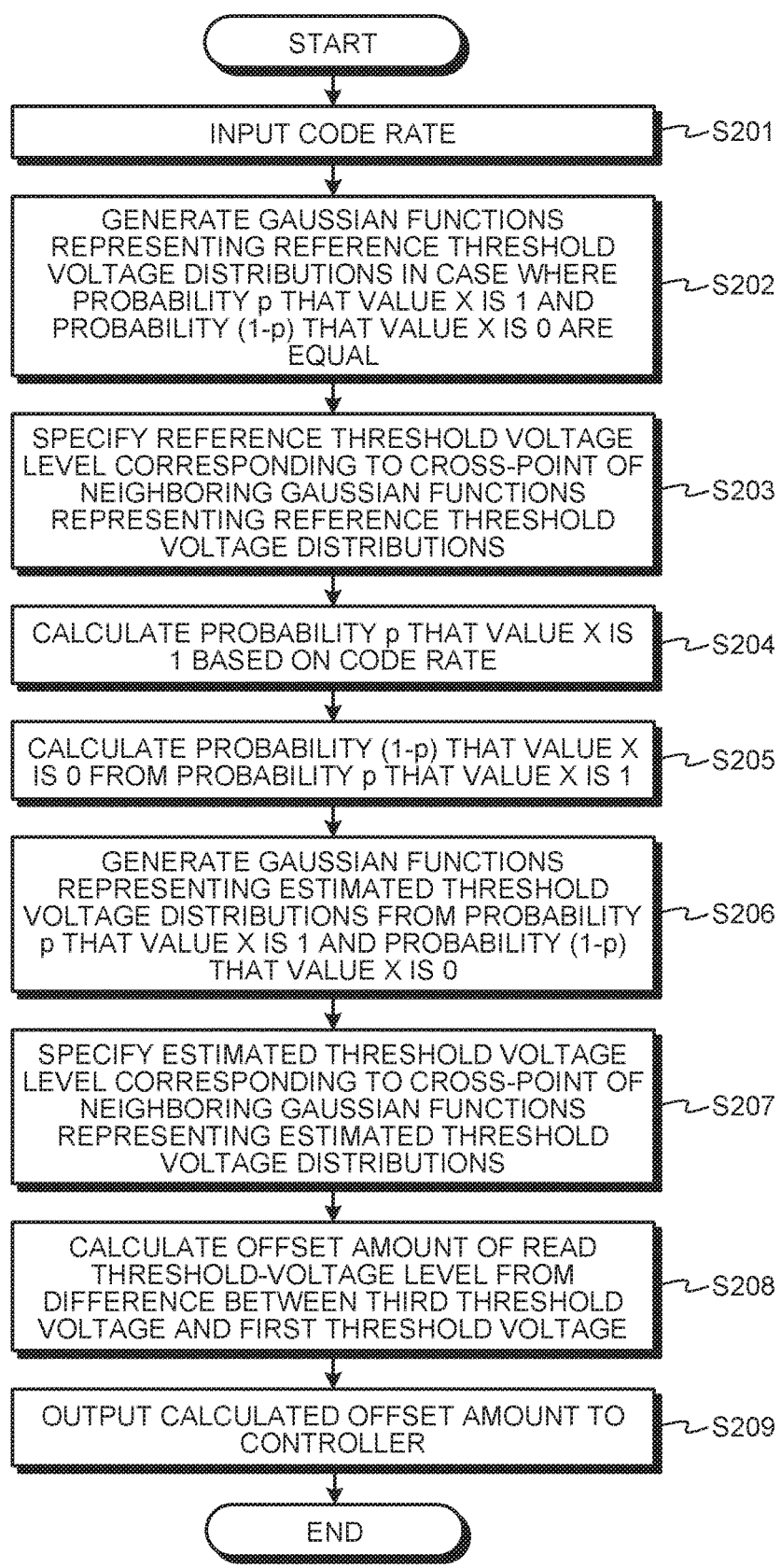
FIG. 9 is a flowchart illustrating a schematic operation example of a memory system according to a second embodiment at the time of setting a threshold-voltage read level.

FIG. 9 is a flowchart illustrating a schematic operation example of the memory system according to the second embodiment at the time of setting the threshold-voltage read level. In FIG. 9, attention is focused on an operation of the error mitigating codec 241 illustrated in FIG. 2. The operation of the memory system 1 at the time of programming can be a normal operation and the operation thereof at the time of readout can be identical to that described with reference to FIG. 8 in the first embodiment, and thus detailed descriptions thereof will be omitted.

The operation at the time of setting the threshold-voltage read level illustrated in FIG. 9 is performed, for example, at the time of manufacturing, shipment, or startup of the memory system 1 similarly to the operation illustrated in FIG. 7. As illustrated in FIG. 9, in the present embodiment, the error mitigating codec 241 receives the code rate input from the controller 23 (Step S201). Subsequently, the error mitigating codec 241 assumes a case where the probability p that the value X is 1 and the probability (1−p) that the value X is 0 are equal, that is, a case where the probability p calculated by the expression (2) described above is ½, and generates Gaussian functions representing reference threshold voltage distributions in the assumed case (Step S202). The reference threshold voltage distributions can be identical to those generated in the first embodiment.

Subsequently, the error mitigating codec 241 obtains a solution of the Gaussian functions of the reference threshold voltage distributions, and specifies a reference threshold voltage level corresponding to the solution (Step S203). The operation at Step S203 can be identical to that illustrated at Step S103 in FIG. 7, for example.

Next, the error mitigating codec 241 calculates the probability p that the value X is 1 using the expression (2) described above based on the code rate input at Step S201 (Step S204) and then calculates the probability (1−p) that the value X is 0 from the probability p that the value X is 1 (Step S205). Next, the error mitigating codec 241 generates Gaussian functions of threshold voltage distributions (estimated threshold voltage distributions) indicating distributions of threshold voltage levels of memory cells to which the respective values have been programmed from the calculated probabilities p and (1−p) (Step S206).

Next, the error mitigating codec 241 obtains a solution of the generated Gaussian functions, and specifies an estimated threshold voltage level corresponding to the solution (Step S207) and obtains a difference between the specified reference and estimated threshold voltage levels to calculate an offset amount from the threshold-voltage read level (Step S208). Thereafter, the error mitigating codec 241 outputs the calculated offset amount to the controller 23 (Step S209) and ends the present operation. The offset amount output to the controller 23 can be held in a predetermined memory area of the non-volatile memory 3 or the data buffer 25, for example, similarly in the first embodiment.

As described above, in the second embodiment, the threshold-voltage read level is adjusted to a threshold voltage level corresponding to a cross-point of adjacent voltage threshold distributions according to probabilities of respective values obtained from the code rate in the error mitigating coding. This enables a more suitable threshold-voltage read level to be used to read out data from the non-volatile memory 3 and thus a lower RBER can be achieved. As a result, the memory system 1 with a higher reliability can be provided.

Other configurations, operations, and effects of the second embodiment are identical to those described in the first embodiment, and thus detailed descriptions thereof will be omitted.

Third Embodiment

A memory system according to a third embodiment is described in detail next with reference to the drawings. In the following descriptions, configurations and operations identical to those described in the above embodiments are dented by like reference signs and redundant descriptions thereof will be omitted.

For example, also when the cells in the non-volatile memory 3 are cells of 2 or more bits such as the MLCs or TLCs, occurrence frequency/probability of bits for each value is programmed can be estimated based on the coding system and the code rate of the error mitigating coding.

Figure 10:
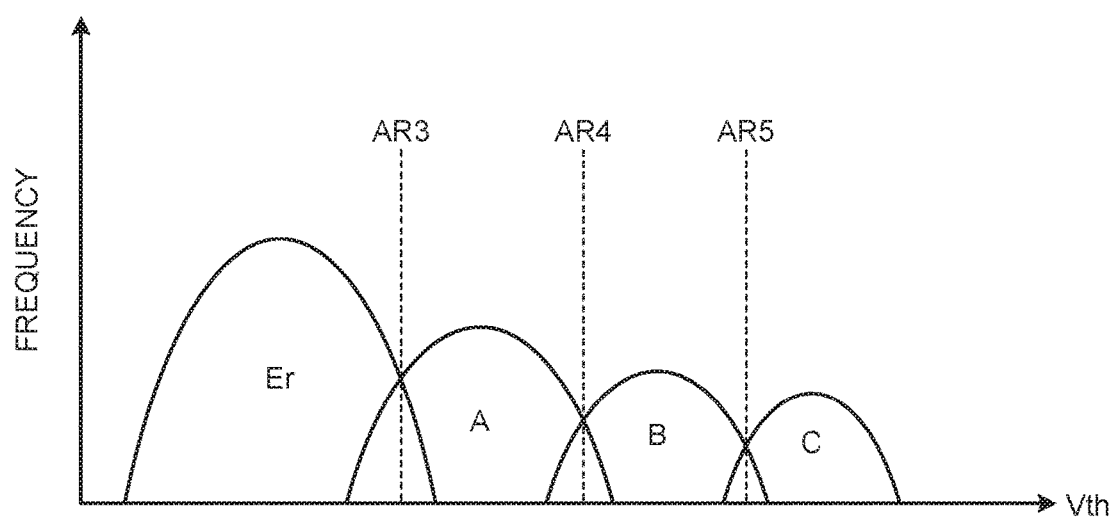
FIG. 10 is a diagram illustrating an example of threshold voltage distributions and threshold-voltage read levels in a case where cells of a non-volatile memory are MLCs.

FIG. 10 is a diagram illustrating an example of threshold voltage distributions and threshold-voltage read levels in a case where cells of a non-volatile memory are the MLCs. As illustrated in FIG. 10, for example, when the cells of the non-volatile memory 3 are the MLCs, threshold voltage distributions ("Er", "A", "B", and "C") indicating distributions of threshold voltage levels of memory cells in which respective values are ideally Gaussian distributions, respectively.

Therefore, adjacent two threshold voltage distributions among the threshold voltage distributions "Er", "A", "B", and "C" can be expressed by the following expression (3)

that adds up a Gaussian distribution using an average $\mu_k$ and a dispersion $\sigma_k$ as parameters and a Gaussian distribution using an average $\mu_{k+1}$ and a dispersion $\sigma_{k+1}$ as parameters. In the following expression (3), $p_k$ as an occurrence frequency (or probability) of a smaller value k (first value) among two consecutive (adjacent) values k and k+1 and $p_{k+1}$ is an occurrence frequency (or probability) of a larger value k+1 (second value). These occurrence frequencies (or probabilities) $p_k$ and $p_{k+1}$ can be estimated using the coding system and the code rate of the error mitigating coding as described in the above first (or second) embodiment. Furthermore, i is an integer from 1 to 4 and Q denotes a Q-function represented by the following expression (4).

$$y_i = p_k \times Q\left(\frac{\mu_k - t_i}{\sigma_k}\right) + p_{k+1} \times Q\left(\frac{\mu_{k+1} - t_i}{\sigma_{k+1}}\right) \quad (3)$$

$$Q(x) = \int_x^\infty (2\pi)^{-\frac{1}{2}} (e)^{-\frac{t^2}{2}} dt \quad (4)$$

In the above expression (3), there are a total of four parameters $\mu_k$, $\sigma_k$, $\mu_{k+1}$, and $\sigma_{k+1}$. Therefore, to solve the expression (3), readout processing according to a condition indicated by the following expression (5) needs to be performed at least four times (for example, i=1 to i=4). In the following expression (5), Vth denotes a threshold voltage programmed to cells, and $t_i$ denotes different threshold-voltage read levels for determining whether Vth is 0 or 1.

$$y_i = \begin{cases} 1, & \text{when } Vth \text{ in cell is lower than } t_i \\ 0, & \text{when } Vth \text{ in cell is higher than } t_i \end{cases} \quad (5)$$

The expression (3) described above can be solved directly by using values obtained by at least four times of the readout processing according to the above condition. However, the calculation process is significantly complicated. Therefore, values of the four parameters $\mu_k$, $\sigma_k$, $\mu_{k+1}$, and $\sigma_{k+1}$ can alternatively be estimated from the above expression (3) using characteristics of the Q-function that the value of the Q-function approaches 0 when the random variable x is greatly increased.

A BER of the received word read out from the non-volatile memory 3 can be defined by the following expression (6) using the parameters $\mu_k$, $\sigma_k$, $\mu_{k+1}$, and $\sigma_{k+1}$ specified in the manner described above.

$$BER(Vth) = p_k \times pdf_k + p_{k+1} \times pdf_{k+1} \ldots \quad (6)$$

In this case, $pdf_k$ in the expression (6) is a probability density function of the k-th threshold voltage distribution and $pdf_{k+1}$ is a probability density function of the k+1-th threshold voltage distribution. The probability density functions $pdf_k$ and $pdf_{k+1}$ can be represented by the following expressions (7) and (8) using a Gaussian distribution.

$$pdf_k = \int_x^\infty (2\pi\sigma_k^2)^{-\frac{1}{2}} (e)^{-\frac{(t-\mu_k)^2}{2\sigma_k^2}} dt \quad (7)$$

$$pdf_{k+1} = \int_{-\infty}^x (2\pi\sigma_{k+1}^2)^{-\frac{1}{2}} (e)^{-\frac{(t-\mu_{k+1})^2}{2\sigma_{k+1}^2}} dt \quad (8)$$

By obtaining t that minimizes the BER using the expression (6) defined as described above, an optimal threshold-voltage read level (=t) for distinguishing consecutive (adjacent) two values k and k+1 among possible values can be obtained. When t that minimizes the BER is obtained also for other pairs of consecutive (adjacent) two values in an identical procedure, optimal threshold-voltage read levels AR3 to AR5 (see FIG. 10) to distinguish the corresponding values, respectively, can be also set.

Furthermore, according to the method described above, also when the threshold voltage distributions indicating distributions of the threshold voltage level of the memory cells in which the respective values have been programmed change according to a program condition, an individual difference of the memory system 1, or the like, optimal threshold-voltage read levels can be set to follow the change. For example, even when a gap between the threshold voltage distributions is widened or the threshold voltage distributions are wholly shifted toward a high voltage side or a low voltage side due to an individual difference of the memory system 1, optimal threshold-voltage read levels can be set.

The configuration example of the memory system according to the third embodiment can be identical to, for example, the configuration example of the memory system 1 described in the first embodiment.

Figure 11:
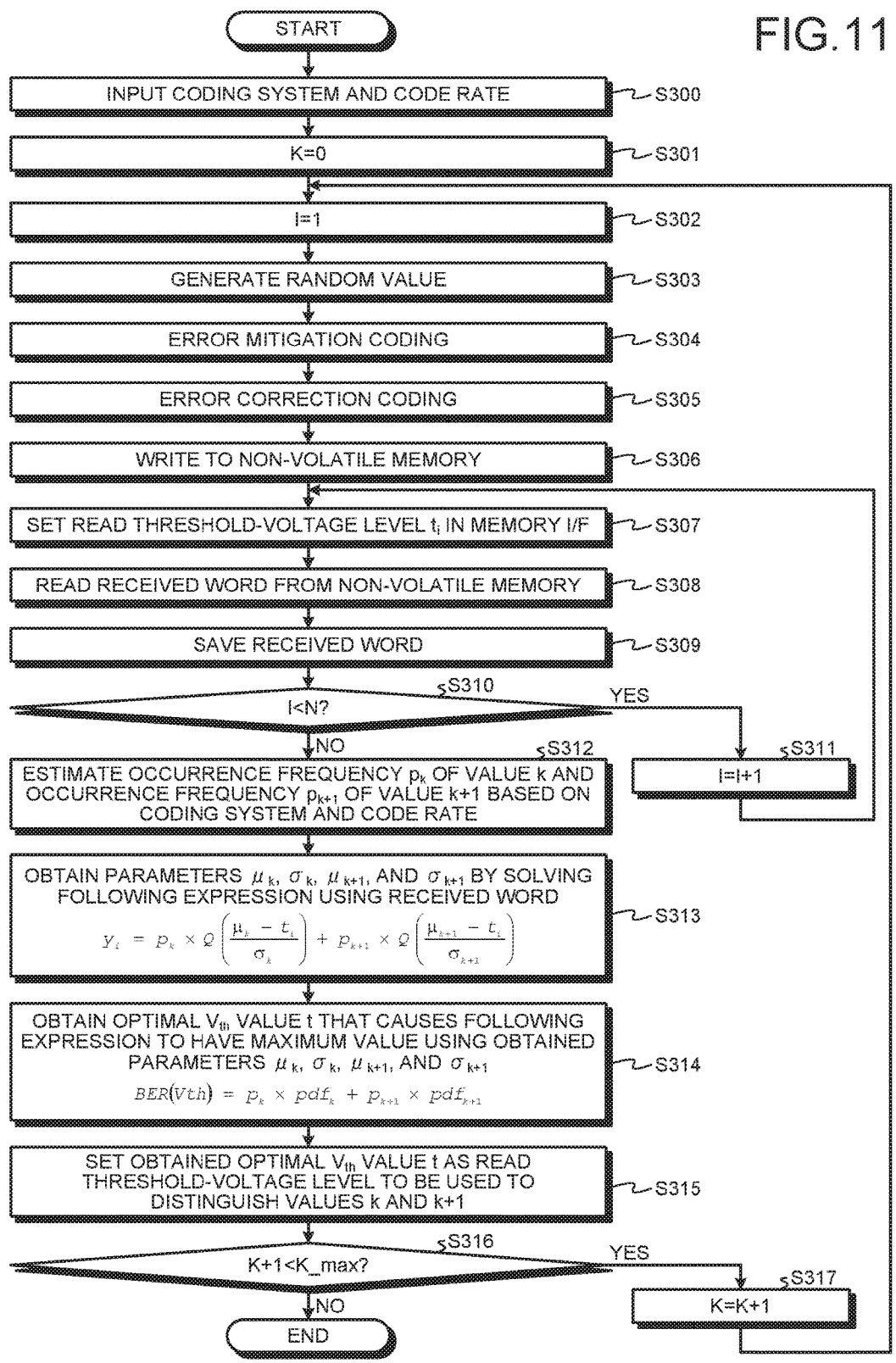
FIG. 11 is a flowchart illustrating a schematic operation example of a memory system according to a third embodiment at the time of setting a threshold-voltage read level.

FIG. 11 is a flowchart illustrating a schematic operation example of the memory system according to the third embodiment at the time of setting the threshold-voltage read level. In FIG. 11, attention is focused on an operation of the error mitigating codec 241 illustrated in FIG. 2. The operation of the memory system 1 at the time of programming can be a normal operation and the operation thereof at the time of readout can be identical to that described with reference to FIG. 8 in the first embodiment, and thus detailed descriptions thereof will be omitted.

The operation at the time of setting the threshold-voltage read level illustrated in FIG. 11 is performed, for example, at the time of manufacturing, shipment, or startup of the memory system 1 similarly to the operation illustrated as an example in FIG. 7 or 9. As illustrated in FIG. 11, in the present operation, the error mitigating codec 241 first receives the coding system and the code rate input from the controller 23 to be used in the error mitigating coding (Step S300). Subsequently, the error mitigating codec 241 resets a value K (=K_max−k; where K_max is a maximum value that can be programmed to the cells in the non-volatile memory 3 and K_max=3 in a case where the cells are the MLCs) of a counter (K=0) to set the threshold-voltage read level, the value K determining which threshold voltage distributions among plural pairs of adjacent threshold voltage distributions are to be distinguished from each other with the threshold-voltage read level (Step S301). The error mitigating codec 241 also sets a value I(=i) of a counter that counts the times of repetitions of the readout processing to 1 (Step S302).

Next, the error mitigating codec 241 generates a random value as user data being a program target (Step S303). Subsequently, the error mitigating codec 241 performs the error mitigating coding of the generated random value (Step S304) and inputs resultant data to the error correction codec 242 to cause the error correction codec 242 to perform the error correction coding (Step S305). As a result, a code word output from the error correction codec 242 is programmed to a predetermined area of the non-volatile memory 3 (Step S306). Programming of the code word output from the error correction codec 242 to the non-volatile memory 3 can be instructed to the memory I/F 22 via the controller 23 or the code word generated by the error correction codec 242 can be input directly to the memory I/F 22 to be programmed to the non-volatile memory 3.

Next, the error mitigating codec 241 sets a threshold-voltage read level $t_i$ in the memory I/F 22 (Step S307) and instructs the memory I/F 22 to read out the code word programmed at Step S306 (Step S308). At that time, the memory I/F 22 performs readout processing using the set threshold-voltage read level A received word read out at Step S308 is temporarily saved in the data buffer 25, for example (Step S309).

Subsequently, the error mitigating codec 241 determines whether the value I of the counter is smaller than an upper limit N of the number of repetitions of readout (Step S310). When the value I is smaller than the upper limit N (YES at Step S310), the error mitigating codec 241 increments the value I of the counter by 1 (Step S311) and then returns to Step S307 to perform the next readout processing. The upper limit N of the number of repetitions can be at least four as described above. The threshold-voltage read level $t_i$ set at Step S307 is set to a different value for each repetition. The different threshold-voltage read level $t_i$ can be determined in advance for each number of repetitions.

On the other hand, when a result of determination at Step S310 indicates that the value I of the counter has reached the upper value N (NO at Step S310), the error mitigating codec 241 estimates the occurrence frequency (or probability) $p_k$ of the value k and the occurrence frequency (or probability) $p_{k+1}$ of the value k+1 based on the coding system and the code rate input at Step S312.

Next, the error mitigating codec 241 solves the expression (3) described above using N received words temporarily held, for example, in the data buffer 25 to obtain values of the four parameters $\mu_k$, $\sigma_k$, $\mu_{k+1}$, and $\sigma_{k+1}$ (Step S313). The values of the four parameters $\mu_k$, $\sigma_k$, $\mu_{k+1}$, and $\sigma_{k+1}$ can alternatively be estimated from the expression (3) described above by using the characteristics of the Q-function that the value of the Q-function approaches 0 when the random variable x is greatly increased as described above, instead of performing the operation at Step S313.

Next, the error mitigating codec 241 obtains t that causes the expression (6) described above to have a minimum value using the parameters $\mu_k$, and $\sigma_k$, $\mu_{k+1}$, and $\sigma_{k+1}$ obtained at Step S313 (Step S314) and sets the obtained value t as a threshold-voltage read level for distinguishing the values k and k+1 in the memory I/F 22 (Step S315).

Next, the error mitigating codec 241 determines whether a value K+1 obtained by adding 1 to the counter value K is smaller than the maximum value K_max that can be programmed to the cells of the non-volatile memory 3 (Step S316). When the value K+1 is smaller than the maximum value K_max (YES at Step S316), the error mitigating codec 241 increments the counter value K by 1 (Step S317) and then returns to Step S302 to perform processing for the next pair of adjacent threshold voltage distributions. When the value K+1 has reached the maximum value K_max (NO at Step S316), the error mitigating codec 241 ends the present operation.

As described above, in the third embodiment, t that minimizes the BER defined by the expression (6) is obtained, so that an optimal threshold-voltage read level (=t) for distinguishing consecutive (adjacent) two values among possible values can be obtained. This enables a more suitable threshold-voltage read level to be used to read out data from the non-volatile memory 3 and thus a lower RBER can be achieved. As a result, the memory system 1 with a higher reliability can be provided.

Also when the threshold voltage distributions of values change according to a program condition, an individual difference of the memory system 1, or the like, an optimal threshold-voltage read level can be set to follow the change.

Other configurations, operations, and effects of the third embodiment are identical to those described in the first or second embodiment, and thus detailed descriptions thereof will be omitted.

Fourth Embodiment

A memory system according to a fourth embodiment is described in detail next with reference to the drawings. In the following descriptions, configurations and operations identical to those described in the above embodiments are dented by like reference signs and redundant descriptions thereof will be omitted.

On an assumption that the threshold voltage distributions of values are ideal Gaussian distributions, respectively, entropy H of a threshold voltage levels read out from memory cells in the non-volatile memory 3 can be maximized by setting the threshold-voltage read level used for readout to an optimal threshold-voltage read level. This is not limited to the case where the cells of the non-volatile memory 3 are the SLCs and the same holds true for a case where the cells of the non-volatile memory 3 are cells of two or more bits such as the MLCs or the TLCs.

The following expression (9) indicates a definitional equation of the entropy H of a threshold voltage read out from the non-volatile memory 3.

$$H(Vth) = P(\text{state} = k \mid Vth)\log\frac{1}{P(\text{state} = k \mid Vth)} + \quad (9)$$
$$P(\text{state} = k+1 \mid Vth)\log\frac{1}{P(\text{state} = k+1 \mid Vth)}$$

In the expression (9), P is defined by the following expression (10) using a probability density function $P^{(k)}$. The probability density function $P^{(k)}$ used in the fourth embodiment is represented by the following expression (11).

$$P(\text{state} = k \mid Vth)\log\frac{P^{(k)}(Vth = t)}{P^{(k)}(Vth = t) + P^{(k+1)}(Vth = t)} \quad (10)$$

$$P^{(k)}(t) = (2\pi\sigma_k^2)^{-\frac{1}{2}}(e)^{-\frac{(t-\mu_k)^2}{2\sigma_k^2}} \quad (11)$$

In the fourth embodiment, t that causes the above expression (10) to have a maximum value is obtained to find an optimal threshold-voltage read level (=t) for distinguishing consecutive (adjacent) two values k (first value) and k+1 (second value) among possible values.

The configuration example of the memory system according to the fourth embodiment can be identical to, for example, the configuration example of the memory system 1 described in the first embodiment.

Figure 12:
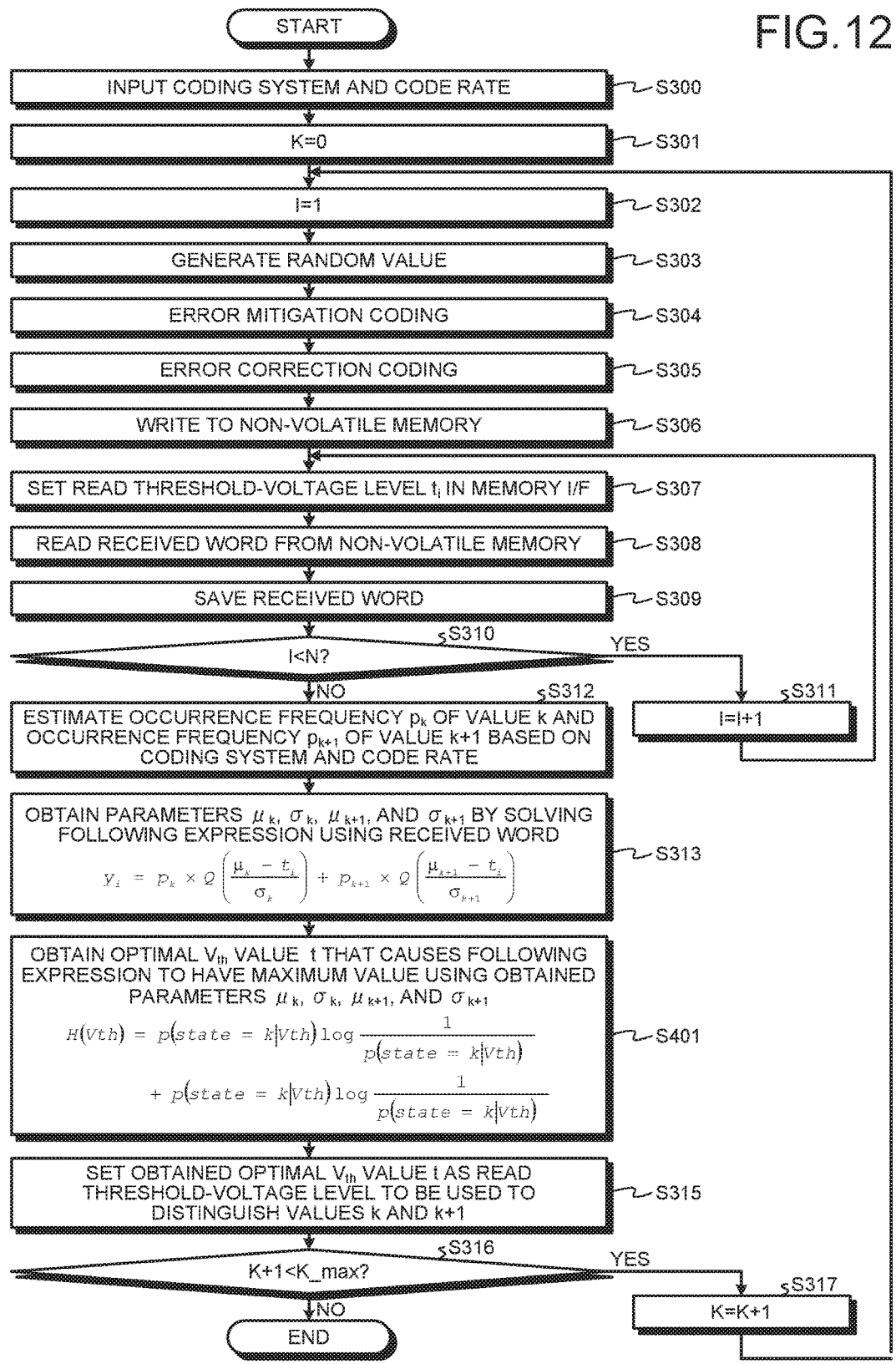
FIG. 12 is a flowchart illustrating a schematic operation example of a memory system according to a fourth embodiment at the time of setting a threshold-voltage read level.

FIG. 12 is a flowchart illustrating a schematic operation example of the memory system according to the fourth embodiment at the time of setting the threshold -voltage read level. In FIG. 12, attention is focused on an operation of the error mitigating codec 241 illustrated in FIG. 2. The operation of the memory system 1 at the time of programming can be a normal operation and the operation thereof at the time of readout can be identical to that described in the first embodiment with reference to FIG. 8, and thus detailed descriptions thereof will be omitted.

In the operation at the time of setting the threshold-voltage read level illustrated in FIG. 12, identical operations to those illustrated as an example at Steps S301 to S313 in FIG. 11 are performed to obtain values of the four parameters $\mu_k$, $\sigma_k$, $\mu_{k+1}$, and $\sigma_{k+1}$. The values of the four parameters $\mu_k$, $\sigma_k$, $\mu_{k+1}$, and $\sigma_{k+1}$ can alternatively be estimated from the expression (3) described above using the characteristics of the Q-function that the value of the Q-function approaches 0 when the random variable x is greatly increased, instead of performing the operation at Step S313.

Next, the error mitigating codec 241 obtains t that causes the expression (9) described above to have a maximum value using the parameters $\mu_k$, $\sigma_k$, $\mu_{k+1}$, and $\sigma_{k+1}$ obtained at Step S313 (Step S401). Thereafter, identical operations to those at Steps S315 to S317 in FIG. 11 are performed to set threshold-voltage read levels for all pairs of adjacent threshold voltage distributions in the memory I/F 22 to end the present operation.

As described above, in the fourth embodiment, an optimal threshold-voltage read level (=t) for distinguishing consecutive (adjacent) two values among possible values can be obtained by obtaining t that maximizes the entropy defined by the expression (9). Accordingly, data can be read out from the non-volatile memory 3 using a more suitable threshold-voltage read level and thus a lower RBER can be achieved. As a result, the memory system 1 with a higher reliability can be provided.

Also when the threshold voltage distributions of values change according to a program condition, an individual difference of the memory system 1, or the like, an optimal threshold-voltage read level can be set to follow the change.

Other configurations, operations, and effects of the fourth embodiment are identical to those described in any of the first to third embodiments, and thus detailed descriptions thereof will be omitted.

The threshold-voltage read level set in the embodiments described above can be used for readout of a user data portion in a code word stored in the non-volatile memory 3, with a redundant portion thereof such as the error mitigating code or the error correction code, or for both thereof.

Fifth Embodiment

A server system can be constructed using a plurality of the memory systems illustrated as examples in the embodiments described above.

Figure 13:
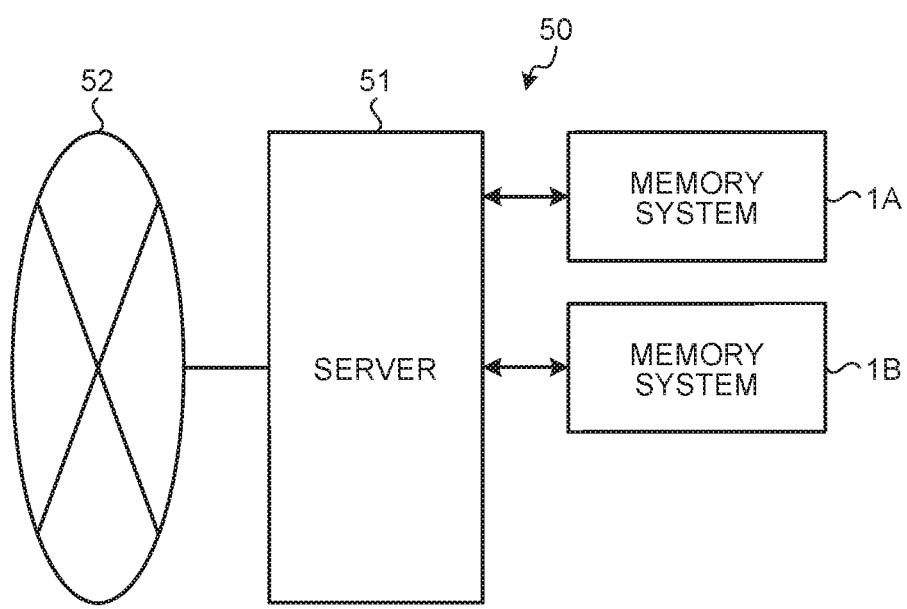
FIG. 13 is a schematic diagram illustrating a schematic configuration example of a server system according to a fifth embodiment.

FIG. 13 is a schematic diagram illustrating a schematic configuration example of a server system according to a fifth embodiment. As illustrated in FIG. 13, a server system 50 includes a server 51 connectable to a predetermined network 52 such as the Internet, a LAN (local area network), or a mobile communication circuit network, and one or more memory systems 1A, 1B, . . . connected to the server 51. Each of the memory systems 1A, 1B, . . . can be the memory system illustrated as an example in any of the embodiments described above.

As the server system 50 including the memory systems 1A, 1B, . . . having enhanced reliabilities is constructed as described above, the reliability of the server system 50 itself can be also enhanced.

Other configurations, operations, and effects of the fifth embodiment are identical to those described in any of the embodiments described above, and thus detailed descriptions thereof will be omitted.

While certain embodiments have been described, these embodiments have been presented by way of example only, and are not intended to the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a non-volatile memory;
   a memory interface that performs programming and reading out with respect to the non-volatile memory;
   a code processor that generates a code word by encoding; and
   a controller that sets a threshold-voltage read level for determining whether a value of each bit in a received word read out from the non-volatile memory is a first value or a second value, wherein
   a difference between the number of bits which have the first value and the number of bits which have the second value in the code word depends on a code rate of the encoding, and
   the controller obtains the threshold-voltage read level based on the code rate.

2. The memory system according to claim 1, wherein
   the code processor includes an error mitigating codec that generates an error mitigation code word of which difference between the number of bits which have the first value and the number of bits which have the second value in the error mitigation code word depends on the code rate,
   the code word includes the error mitigation code parity part,
   the controller inputs the code rate and a coding system that are used in the error mitigating coding to the error mitigating codec,
   the error mitigating codec
      estimates the number of bits which have the first value and the number of bits which have the second value based on the code rate and the coding system, and
      specifies an offset amount from a reference value for a threshold-voltage read level based on the estimated number of bits which have the first value and the estimated number of bits which have the second value, and
   the controller obtains the threshold-voltage read level by adjusting the reference value using the offset amount.

3. The memory system according to claim 2, wherein
   the error mitigating codec
      generates a first Gaussian function using the estimated number of bits which have the first value, the first Gaussian function representing a first threshold voltage distribution indicating a distribution of threshold voltage levels of memory cells in each of which the first value is programmed, generates a second Gaussian function using the estimated number of bits which have the second value, the second Gaussian function representing a second threshold voltage distribution indicating a distribution of threshold voltage levels of memory cells in each of which the second value is programmed, and specifying the offset amount by obtaining a cross-point of the generated first Gaussian function and the generated second Gaussian function.

4. The memory system according to claim 1, wherein
the code processor includes an error mitigating codec that generates an error mitigation code word of which difference between the number of bits which have the first value and the number of bits which have the second value in the error mitigation code depends on the code rate, the code word includes the error mitigation code parity part, the controller inputs the code rate and a coding system that are used in the error mitigating coding to the error mitigating codec, the error mitigating codec
  obtains a first probability that a value of each bit in the code word is the first value and a second probability that a value of each bit in the code word is the second value based on the code rate and the coding system, and
  specifies an offset amount from a reference value for a threshold-voltage read level using the obtained first and second probabilities, and the controller obtains the threshold-voltage read level by adjusting the reference value using the offset amount.

5. The memory system according to claim 4, wherein
the error mitigating codec
  generates a first Gaussian function based on the first probability, the first Gaussian function representing a first threshold voltage distribution indicating a distribution of threshold voltage levels of memory cells in each of which the first value is programmed,
  generates a second Gaussian function based on the second probability, the second Gaussian function representing a second threshold voltage distribution indicating a distribution of threshold voltage levels of memory cells in each of which the second value is programmed, and
  specifying the offset amount by obtaining a cross-point of the generated first Gaussian function and the generated second Gaussian function.

6. The memory system according to claim 1, wherein
the code processor includes an error mitigating codec that generates an error mitigation code of which difference between the number of bits which have the first value and the number of bits which have the second value in the error mitigation code depends on the code rate, the code word includes the error mitigation code parity part, the controller inputs the code rate and a coding system that are used in the error mitigating coding to the error mitigating codec, and the error mitigating codec
  instructs the memory interface to perform reading out with respect to the non-volatile memory at least four times using different threshold-voltage read levels, respectively,
  specifies a threshold voltage level at which a bit error rate of read received word is estimated to be a minimum value using the coding system and the code rate input from the controller and at least four received words obtained by the at least four times of the reading out, and
  obtains the specified threshold voltage level as the threshold-voltage read level.

7. The memory system according to claim 1, wherein
the code processor includes an error mitigating codec that generates an error mitigation code of which difference between the number of bit which have the first value and the number of bit which have the second value in the error mitigation code depends on the code rate, the code word includes the error mitigation code, the controller inputs the code rate and a coding system that are used in the error mitigating coding to the error mitigating codec, and the error mitigating codec
  estimates $p_k$ as an occurrence frequency or probability of a first value k in the code word and $p_{k+1}$ as an occurrence frequency or probability of a second value k+1 in the code word based on the code rate and the coding system,
  instructs the memory interface to perform reading out with respect to the non-volatile memory at least four times using different threshold-voltage read levels $t_i$, respectively,
  solving a following expression (1) using at least four received words obtained by the at least four times of the reading out to specify parameters $\mu_k$, $\sigma_k$, $\mu_{k+1}$, and $\sigma_{k+1}$ in the expression (1), $$y_i = p_k \times Q\left(\frac{\mu_k - t_i}{\sigma_k}\right) + p_{k+1} \times Q\left(\frac{\mu_{k+1} - t_i}{\sigma_{k+1}}\right) \quad (1)$$

$$\text{where } Q(x) = \int_x^\infty (2\pi)^{-\frac{1}{2}} (e)^{-\frac{t^2}{2}} dt, i = 1, 2, 3, 4, \ldots$$

specifies a value t that minimizes a bit error rate (BER) represented by a following expression (2) using the specified parameters $\mu_k$, $\sigma_k$, $\mu_{k+1}$, and $\sigma_{k+1}$, and $$BER(Vth) = p_k \times \int_x^\infty (2\pi\sigma_k^2)^{-\frac{1}{2}} (e)^{-\frac{(t-\mu_k)^2}{2\sigma_k^2}} dt + \quad (2)$$

$$p_{k+1} \times \int_{-\infty}^x (2\pi\sigma_{k+1}^2)^{-\frac{1}{2}} (e)^{-\frac{(t-\mu_{k+1})^2}{2\sigma_{k+1}^2}} dt$$

obtains the specified value t as the threshold-voltage read level.

8. The memory system according to claim 1, wherein
the code processor includes an error mitigating codec that generates an error mitigation code of which difference between the number of bit which have the first value and the number of bit which have the second value in the error mitigation code depends on the code rate, the code word includes the error mitigation code parity part, the controller inputs the code rate and a coding system that are used in the error mitigating coding to the error mitigating codec, and the error mitigating codec
  instructs the memory interface to perform reading out with respect to the non-volatile memory at least four times using different threshold-voltage read levels, respectively, specifies a threshold voltage level at which entropy of read received word is estimated to be a maximum value using the coding system and the code rate input from the controller and at least four received words obtained by the at least four times of the reading out, and obtains the specified threshold voltage level as the threshold-voltage read level.

9. The memory system according to claim 1, wherein the code processor includes an error mitigating codec that generates an error mitigation code of which difference between the number of bit which have the first value and the number of bit which have the second value in the error mitigation code depends on the code rate, the code word includes the error mitigation code parity part, the controller inputs the code rate and a coding system that are used in the error mitigating coding to the error mitigating codec, and the error mitigating codec estimates $p_k$ as an occurrence frequency or probability of a first value k in the code word and $p_{k+1}$ as an occurrence frequency or probability of a second value k+1 in the code word. based on the code rate and the coding system, instructs the memory interface to perform reading out with respect to the non-volatile memory at least four times using different threshold-voltage read levels $t_i$, respectively, solving a following expression (1) using at least four received words obtained by the at least four times of the reading out to specify parameters $\mu_k$, $\sigma_k$, $\mu_{k+1}$, and $\sigma_{k+1}$ in the expression (1), $$y_i = p_k \times Q\left(\frac{\mu_k - t_i}{\sigma_k}\right) + p_{k+1} \times Q\left(\frac{\mu_{k+1} - t_i}{\sigma_{k+1}}\right) \qquad (1)$$

-continued where $Q(x) = \int_x^\infty (2\pi)^{-\frac{1}{2}}(e)^{-\frac{t^2}{2}} dt, i = 1, 2, 3, 4, \ldots$ specifies a value t that maximizes entropy H represented by a following expression (2) using the specified parameters $\mu_k$, $\sigma_k$, $\mu_{k+1}$, and $\sigma_{k+1}$, and $$H(Vth) = P(\text{state} = k \mid Vth)\log\frac{1}{P(\text{state} = k \mid Vth)} + \qquad (2)$$

$$P(\text{state} = k+1 \mid Vth)\log\frac{1}{P(\text{state} = k+1 \mid Vth)}$$

where $P(\text{state} = k \mid Vth) = \frac{P^{(k)}(Vth = t)}{P^{(k)}(Vth = t) + P^{(k+1)}(Vth = t)}$, and $$P^{(k)}(t) = (2\pi\sigma_k^2)^{-\frac{1}{2}}(e)^{-\frac{(t-\mu_k)^2}{2\sigma_k^2}}$$

obtains the specified value t as the threshold-voltage read level.

10. The memory system according to claim 1, wherein the code processor includes an error mitigating codec that generates an error mitigation code of which difference between the number of bit which have the first value and the number of bit which have the second value is the error mitigation code depends on the code rate, and an error correction codec that generates the code word by performing error correction coding of data including the error mitigation code generated by the error mitigating codec, and the memory interface programs the code word generated by the error mitigating codec to the non-volatile memory.

* * * * *